(12) United States Patent
Yu et al.

(10) Patent No.: US 8,901,538 B2
(45) Date of Patent: Dec. 2, 2014

(54) NANO RESONATOR AND MANUFACTURING METHOD THEREOF

(71) Applicant: Samsung Electronics Co., Ltd., Suwon-si (KR)

(72) Inventors: Jie Ai Yu, Suwon-si (KR); Duck Hwan Kim, Goyang-si (KR); In Sang Song, Osan-si (KR); Jing Cui, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/846,685

(22) Filed: Mar. 18, 2013

(65) Prior Publication Data

US 2014/0021443 A1  Jan. 23, 2014

(30) Foreign Application Priority Data

Jul. 18, 2012 (KR) .................. 10-2012-0078313

(51) Int. Cl.
| | |
|---|---|
| *H01L 31/0336* | (2006.01) |
| *H01L 31/072* | (2012.01) |
| *H01L 29/745* | (2006.01) |
| *H01L 29/76* | (2006.01) |
| *H01L 21/336* | (2006.01) |
| *B81C 1/00* | (2006.01) |
| *B81B 3/00* | (2006.01) |
| *H03H 3/007* | (2006.01) |
| *H03H 9/24* | (2006.01) |

(52) U.S. Cl.
CPC ........... *B81C 1/00134* (2013.01); *B81B 3/0018* (2013.01); *H03H 3/0072* (2013.01); *H03H 9/2463* (2013.01)
USPC ............. 257/24; 257/213; 257/401; 257/403; 438/279; 438/300

(58) Field of Classification Search
CPC .... B82Y 10/90; B82Y 15/00; B81C 1/00134; B82B 1/001; B82B 1/008; B82B 3/0009; B82B 3/0014; B82B 3/0038; B82B 3/0047; B82B 3/0052; B82B 3/0061; B82B 3/0066; B82B 3/0095
USPC .............. 257/24, 57, 213, 401, 403; 438/163, 438/279, 584
See application file for complete search history.

(56) References Cited

U.S. PATENT DOCUMENTS

| | | | |
|---|---|---|---|
| 8,338,280 B2 * | 12/2012 | Tan et al. ...................... | 438/514 |
| 2007/0023621 A1 * | 2/2007 | Blick et al. .................... | 250/251 |

(Continued)

FOREIGN PATENT DOCUMENTS

| | | | |
|---|---|---|---|
| JP | 2006-270107 A | 10/2006 | |
| JP | 2009-198467 A | 9/2009 | |

(Continued)

*Primary Examiner* — Hsien Ming Lee
(74) *Attorney, Agent, or Firm* — NSIP Law

(57) ABSTRACT

A nano resonator includes a substrate, a first insulating layer disposed on the substrate, a first source disposed on the first insulating layer at a first position, a first drain disposed on the first insulating layer at a second position spaced apart from the first position so that the first drain faces the first source, a first nano-wire channel having a first end connected to the first source and a second end connected to the first drain, and having a doping type and a doping concentration that are identical to a doping type and a doping concentration of the first source and the first drain, and a second nano-wire channel disposed at a predetermined distance from the first nano-wire channel in a direction perpendicular to the substrate or a direction parallel to the substrate.

24 Claims, 12 Drawing Sheets

(56) References Cited

U.S. PATENT DOCUMENTS

2010/0276662 A1 11/2010 Colinge
2012/0126327 A1* 5/2012 Song et al. .................... 257/365

FOREIGN PATENT DOCUMENTS

| KR | 10-2006-0001987 A | 1/2006 |
| KR | 10-2009-0081218 A | 7/2009 |

* cited by examiner

NANO RESONATOR AND MANUFACTURING METHOD THEREOF

CROSS-REFERENCE TO RELATED APPLICATIONS

This application claims the benefit under 35 USC 119(a) of Korean Patent Application No. 1 0-201 2-007831 3 filed on Jul. 18, 2012, in the Korean Intellectual Property Office, the disclosure of which is incorporated herein by reference in its entirety for all purposes.

BACKGROUND

1. Field

The following description relates to a nano resonator having a high sensitivity and a manufacturing method thereof.

2. Description of Related Art

As electronic technology develops, a variety of mobile devices are being developed and produced in micro sizes. In order to meet a demand for such micro sized mobile devices, a microelectromechanical system (MEMS) technology for designing a machine or equipment having a fine structure smaller than a millimeter (mm) scale, or a nanoelectromechanical system (NEMS) technology for designing a machine or equipment having an ultrafine structure smaller than a micrometer ($\mu$m) scale are currently in use.

A nano resonator that is manufactured by the NEMS technology and has a mechanical resonator that generates a signal or detects a signal may be employed in various fields as a nano sensor. For example, the nano resonator may be applied as a physical quantity sensor to measure a weight in particle units in a mass spectrometer and other applications requiring a physical quantity sensor. The nano resonator needs to have a high sensitivity in order to measure the weight in particle units.

SUMMARY

In one general aspect, a nano resonator includes a substrate; a first insulating layer disposed on the substrate; a first source disposed on the first insulating layer at a first position; a first drain disposed on the first insulating layer at a second position spaced apart from the first position so that the first drain faces the first source; a first nano-wire channel having a first end connected to the first source and a second end connected to the first drain, and having a doping type and a doping concentration that are identical to a doping type and a doping concentration of the first source and the first drain; and a second nano-wire channel disposed at a predetermined distance from the first nano-wire channel in a direction perpendicular to the substrate or a direction parallel to the substrate.

The first insulating layer may not be disposed between the substrate and the first nano-wire channel so that the first nano-wire channel is spaced apart from the substrate, and is suspended from the first source and the first drain.

The first insulating layer may not be disposed on a portion of the substrate between the first position and the second position; and the nano resonator may further include a gate insulating layer disposed on the portion of the substrate where the first insulating layer is not disposed; and a gate electrode disposed on the gate insulating layer.

The doping concentration may be in a range of $1 \times 10^{19}/\text{cm}^{-3}$ to $1 \times 10^{20}/\text{cm}^{-3}$.

The first nano-wire channel may have a thickness in a direction perpendicular to the substrate that is less than a maximum width of a depletion region in the first nano-wire channel.

The second nano-wire channel may be disposed parallel to the first nano-wire channel at the predetermined distance from the first nano-wire channel in the direction parallel to the substrate; a first end of the second nano-wire channel may be connected to the first source, and a second end of the second nano-wire channel may be connected to the first drain; and the second nano-wire channel may have a doping type and a doping concentration that are identical to the doping type and the doping concentration of the first source and the first drain.

The first source and the first drain may be divided into a first section in which the first nano-wire channel is connected to the first source and the first drain, and a second section in which the second nano-wire channel is connected to the first source and the first drain.

The nano resonator may further include a third nano-wire channel disposed parallel to the first nano-wire channel and the second nano-wire channel at the predetermined distance from the first nano-wire channel in the direction parallel to the substrate so that the first nano-wire channel is disposed between the second nano-wire channel and the third nano-wire channel; a first end of the third nano-wire channel may be connected to the first source, and a second end of the third nano-wire channel may be connected to the first drain; and the third nano-wire channel may have a doping type and a coping concentration that are identical to the doping type and the doping concentration of the first source and the first drain.

The first source and the first drain may be divided into a first section in which the first nano-wire channel is connected to the first source and the first drain, a second section in which the second nano-wire channel is connected to the first source and the first drain, and a third section in which the third nano-wire channel is connected to the first source and the first drain.

The nano resonator may further include a second insulating layer disposed on the first source and the first drain; a second source disposed on the second insulating layer at the first position; and a second drain disposed on the second insulating layer at the second position so that the second drain faces the second source; wherein the second nano-wire channel may be disposed at the predetermined distance from the first nano-wire in the direction perpendicular to the substrate; a first end of the second nano-wire channel may be connected to the second source, and a second end of the second nano-wire channel may be connected to the second drain; and the second nano-wire channel may have a doping type and a doping concentration that are identical to a doping type and a doping concentration of the second source and the second drain.

In another general aspect, a method of manufacturing a nano resonator includes forming a first insulating layer on a substrate; forming a first semiconductor layer on the first insulating layer, the first semiconductor layer having a predetermined doping type and a predetermined doping concentration; forming a first source on the first insulating layer at a first position by etching the first semiconductor layer; forming a first drain on the first insulating layer at a second position spaced apart from the first position so that the first drain faces the first source by etching the first semiconductor layer; forming a first nano-wire channel having a first end connected to the first source and a second end connected to the first drain by etching the first semiconductor layer; and forming a second nano-wire channel disposed at a predetermined distance from the first nano-wire channel in a direction perpendicular to the substrate or a direction parallel to the substrate.

The etching of the first semiconductor layer to form the first source, the first drain, and the first nano-wire channel may expose a portion of the first insulating layer; and the method may further include etching away the exposed portion of the first insulating layer.

The method of claim may further include etching away a portion of the first insulating layer between the substrate and the first nano-wire channel so that the first nano-wire channel is spaced apart from the substrate, and is suspended from the first source and the first drain.

The etching away of the exposed portion of the first insulating layer may expose a portion of the substrate; and the method may further include forming a gate insulating layer on a portion of the exposed portion of the substrate; and forming a gate electrode on the gate insulating layer.

The forming of the second nano-wire channel may include forming the second nano-wire channel by etching the first semiconductor layer so that the second nano-wire channel is disposed parallel to the first nano-wire channel at the predetermined distance from the first nano-wire channel in the direction parallel to the substrate, a first end of the second nano-wire channel is connected to the first source, and a second end of the second nano-wire channel is connected to the first drain.

The method may further include etching the first source and the first drain to divide the first source and the first drain into a first section in which the first nano-wire channel is connected to the first source and the first drain, and a second section in which the second nano-wire channel is connected to the first source and the first drain.

The method may further include forming a third nano-wire channel by etching the first semiconductor layer so that the third nano-wire channel is disposed parallel to the first nano-wire channel and the second nano-wire channel at the predetermined distance from the first nano-wire channel in the direction parallel to the substrate, the first nano-wire channel is disposed between the second nano-wire channel and the third nano-wire channel, a first end of the third nano-wire channel is connected to the first source, and a second end of the third nano-wire channel is connected to the first drain.

The method may further include etching the first source and the first drain to divide the first source and the first drain into a first section in which the first nano-wire channel is connected to the first source and the first drain, a second section in which the second nano-wire channel is connected to the first source and the first drain, and a third section in which the third nano-wire channel is connected to the first source and the first drain.

The method may further include forming a second insulating layer on the first semiconductor layer before etching the first semiconductor layer; and forming a second semiconductor layer on the second insulating layer, the second semiconductor layer having a predetermined doping type and a predetermined doping concentration.

The forming of the second nano-wire channel may include forming a second source on the second insulating layer at the first position by etching the second semiconductor layer; forming a second drain on the second insulating layer at the second position so that the second drain faces the second source by etching the second semiconductor layer; and forming the second nano-wire channel by etching the second semiconductor layer so that a first end of the second nano-wire channel is connected to the second source, a second end of the second nano-wire channel is connected to the second drain, and the second nano-wire channel is disposed at the predetermined distance from the first nano-wire channel in the direction perpendicular to the substrate.

Other features and aspects will be apparent from the following detailed description, the drawings, and the claims.

DETAILED DESCRIPTION

Figure 1:
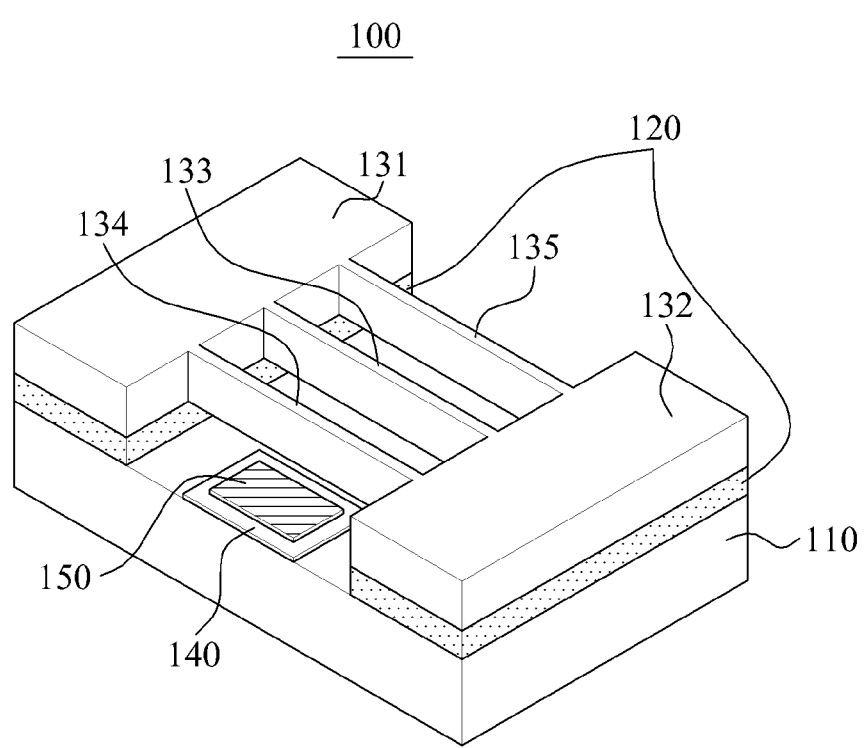
FIG. 1 illustrates an example of a nano resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill the art, with the exception of operations necessarily occurring in a certain order. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

FIG. 1 illustrates an example of a nano resonator. Referring to FIG. 1, a nano resonator 100 includes a substrate 110, an insulating layer 120, a source 131, a drain 132, a first nano-wire channel 133, a second nano-wire channel 134, a third nano-wire channel 135, a gate insulator 140, and a gate electrode 150.

The substrate 110 may be a silicon substrate. However, the substrate 110 is not limited to a silicon substrate, and may be any other semiconductor substrate that is capable of being used in a nano resonator.

The insulating layer 120 is formed on the substrate 110 at a first position and a second position spaced apart from the first position, and includes silicon dioxide ($SiO_2$) or silicon germanium (SiGe). A remaining portion of the substrate between the first position and the second position is left exposed.

The source 131 is formed on the insulating layer 120 at the first position.

The drain 132 is formed on the insulating layer 120 at the second position so that the drain 132 faces the source 131.

Although not shown in FIG. 1, a source electrode may be formed on the source 131, and a drain electrode may be formed on the drain 132.

The gate insulator 140 is formed on the exposed portion of the substrate 110 between the insulating layer 120 at the first position and the insulating layer 120 at the second position. A gate electrode 150 is formed on the gate insulator 140. The gate insulator 140 reduces a coupling effect between the substrate 110 and the gate electrode 150.

One end of the first nano-wire channel 133 is connected to the source 131, and the other end of the first nano-wire channel 133 is connected to the drain 132. The insulating layer 120 is not disposed between the substrate 110 and the first nano-wire channel 133. Accordingly, the first nano-wire channel 133 is spaced apart from the substrate 110, and is suspended from the source 131 and the drain 132.

The source 131, the drain 132, and the first nano-wire channel 133 are doped with an n-type impurity or a p-type impurity, and the doping concentration is in a range of $1\times10^{19}/cm^{-3}$ to $1\times10^{20}/cm^{-3}$. When the doping concentration of the first nano-wire channel 133 is lower than the range of $1\times10^{19}/cm^{-3}$ to $1\times10^{20}/cm^{-3}$, a contact resistance between the source 131 and the drain 132 will increase. Accordingly, a contact resistance between the source 131 and the drain 132 that is within tolerance limits may be achieved by making the doping concentration of the first nano-wire channel 133 be in the range of $1\times10^{19}/cm^{-3}$ to $1\times10^{20}/cm^{-3}$.

The source 131, the drain 132, and the first nano-wire channel 133 include any one or any combination of silicon, polysilicon, germanium (Ge), amorphous silicon (a-Si), SiGe, silicon carbide (SiC), a Group III-semiconductor material, and a Group V-semiconductor material.

The first nano-wire channel 133 has a thickness in a direction perpendicular to the substrate 110 that is less than a maximum width of a depletion region that is formed in the first nano-wire channel 133. The maximum width of the depletion region may be calculated according to the following Equation 1.

$$W_{max} = \frac{2}{q}\sqrt{\frac{\varepsilon KT}{N}\ln\frac{N}{n_i}} \qquad (1)$$

In Equation 1, $W_{max}$ denotes the maximum width of the depletion region, q denotes the electron charge, K denotes the Boltzmann constant, $\varepsilon$ denotes an absolute permittivity, T denotes an absolute temperature, N denotes a channel doping concentration of the nano-wire channel, and $n_i$ denotes an intrinsic carrier concentration.

For example, when the doping concentration of the first nano-wire channel 133 is $10^{20}/cm^{-3}$, the maximum width $W_{max}$ of the depletion region formed in the first nano-wire channel 133 is 3.93 nanometers (nm). Accordingly, the thickness of the first nano-wire channel 133 in a direction perpendicular to the substrate 110 is less than 3.93 nm.

Since the source 131, the drain 132, and the first nano-wire channel 133 have an identical doping type and doping concentration, when a positive bias voltage is applied to the gate electrode 140, the nano resonator 100 is in an ON state in which electrons move through the first nano-wire channel 133 between the source 131 and the drain 312 under a flat-band condition. However, when a negative bias voltage is applied to the gate electrode 140, the depletion region expands to fill the entire thickness of the first nano-wire channel 133 in a direction perpendicular to the substrate 110, causing the first nano-wire channel 133 to be depleted and preventing electrons from moving through the first nano-wire channel 133 between the source 131 and the drain 132, so that the nano resonator 100 is in an OFF state.

In addition to the first nano-wire channel 133 discussed above, the nano resonator 100 may include at least one additional nano-wire channel that is formed parallel to the first nano-wire channel 133 in a horizontal direction of the first nano-wire channel 133, that is, in a direction parallel to the substrate 110. In the example in FIG. 1, the nano resonator 100 includes the second nano-wire channel 134 and the third nano-wire channel 135 that are disposed parallel to the first nano-wire channel 133 at a distance apart from either side of the first nano-wire channel 133.

One end of each of the second nano-wire channel 134 and the third nano-wire channel 135 is connected to the source 131, and the other end of each of the second nano-wire channel 134 and the third nano-wire channel 135 is connected to the drain 132. The first nano-wire channel 133 through the third nano-wire channel 135 may be integrally formed with the source 131 and the drain 132, or may be formed separately and joined to the source 131 and the drain 132.

The second nano-wire channel 134 and the third nano-wire channel 135 may have a doping type and a doping concentration that are identical to the doping type and the doping concentration of the source 131 and the drain 132. Accordingly, the source 131, the drain 132, and the first nano-wire channel 133 through the third nano-wire channel 135 may form a junction-free structure in which a doping area is not divided.

Further, the insulating layer 120 is not disposed between the substrate 110 and each of the second nano-wire channel 134 and the third nano-wire channel 135. Accordingly, the second nano-wire channel 134 and the third nano-wire channel 135, like the first nano-wire channel 133, are spaced apart from the substrate 110, and are suspended from the source 131 and the drain 132. This suspended structure enables the first nano-wire channel 133 through the third nano-wire channel 135 to vibrate between the source 131 and the drain 132 at a resonant frequency of the first nano-wire channel 133 through the third nano-wire channel 135, thereby performing a function of detecting a signal having a frequency equal to the resonant frequency.

A signal detection sensitivity of a resonator may vary depending on a characteristic of a nano-wire channel having a resonant frequency. In particular, since the signal detection sensitivity of the resonator is proportional to a volume of the nano-wire channel, the nano resonator 100 having the first nano-wire channel 133 through the third nano-wire channel 135 has a high sensitivity compared to a resonator including a single resonance channel, for example, a single nano-wire channel.

Also, since the nano resonator 100 shown in FIG. 1 detects the signal having the frequency equal to the resonant frequency via the first nano-wire channel 133 through the third nano-wire channel 135 disposed in parallel, a loss of the nano resonator 100 in detecting the signal is reduced. Since the loss is reduced, the nano resonator 100 has a relatively higher sensitivity.

Although the number of nano-wire channels provided in the nano resonator 100 may be increased to improve the sensitivity of the resonator, the number of nano-wire channels may be adjusted based on the desired size and price of the nano resonator 100 and other production factors.

Although FIG. 1 shows the first nano-wire channel 133 through the third nano-wire channel 135 having an identical length, the first nano-wire channel 133 through the third nano-wire channel 135 may have different lengths. Since the first nano-wire channel 133 to the third nano-wire channel 135 having the different lengths have different resonant frequencies, the nano resonator 100 may be used as a multi-oscillator.

Figure 2:
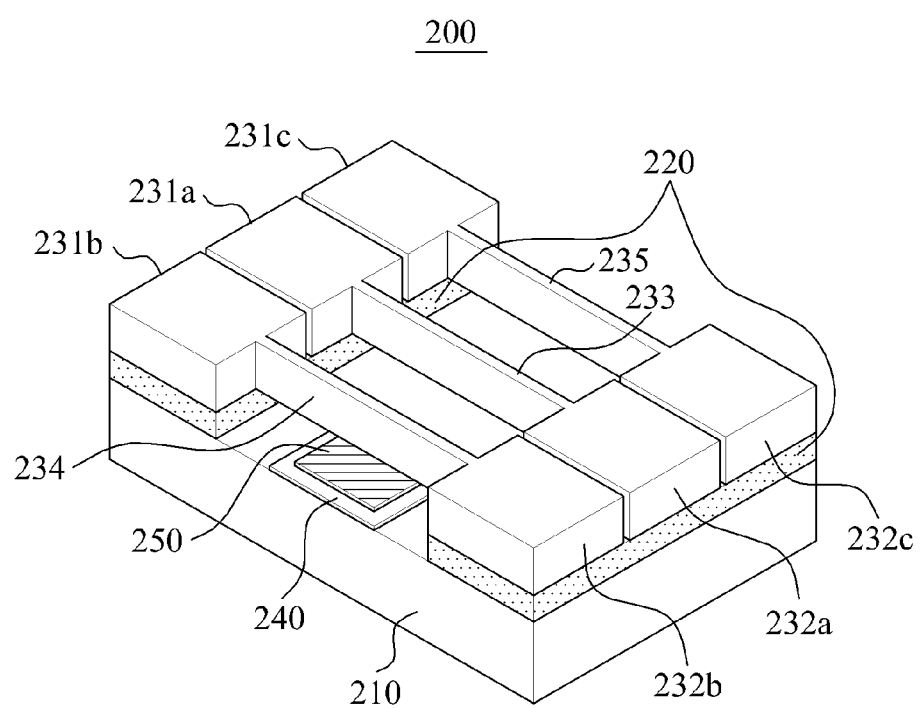
FIG. 2 illustrates another example of a nano resonator.

FIG. 2 illustrates another example of a nano resonator. A nano resonator 200 is a modified example of the nano resonator 100 of FIG. 1. The nano resonator 200 includes a substrate 210, an insulating layer 220, sources 231a, 231b, and 231c, drains 232a, 232b, and 232c, a first nano-wire channel 233, a second nano-wire channel 234, a third nano-wire channel 235, a gate insulator 240, and a gate electrode 250. Since a remaining configuration of the nano resonator 200 aside from the sources 231a to 231c and the drains 232a to 232c is similar to the configuration of the nano resonator 100 shown in FIG. 1, a further detailed description of the remaining configuration of the nano resonator 200 will be omitted for conciseness.

The sources 231a to 231c and the drains 232a to 232c may have a structure that is divided into sections in which the first nano-wire channel 233 to the third nano-wire channel 235 are connected to the sources 231a to 231c and the drains 232a to 232c. More particularly, the sources 231a to 231c and the drains 232a to 232c may be divided into a first section in which the first nano-wire channel 233 is connected to the source 231a and the drain 232a, a second section in which the second nano-wire channel 234 is connected to the source 231b and the drain 232b, and a third section in which the third nano-wire channel 235 is connected to the source 231c and the drain 232c. The sources 231a to 231c and the drains 232a to 232c may be disposed at uniform intervals spaced apart from each other.

The nano resonator 200 shown in FIG. 2 has the capability of detecting signals having respective resonant frequencies of the first nano-wire channel 233 to the third nano-wire channel 235 via the sources 231a to 231c and the drains 232a to 232c. The resonant frequencies of the first nano-wire channel 233 to the third nano-wire channel 235 may be the same, or they may be different.

Figure 3:
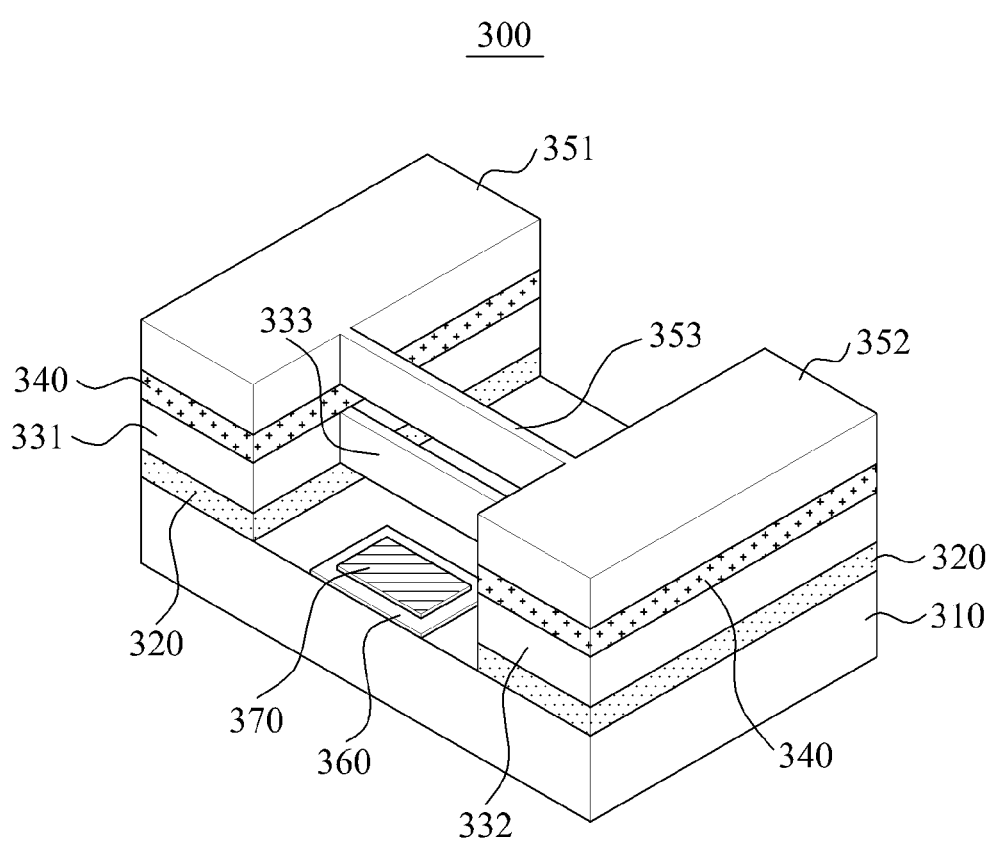
FIG. 3 illustrates another example of a nano resonator.

FIG. 3 illustrates another example of a nano resonator. Referring to FIG. 3, a nano resonator 300 includes a substrate 310, a first insulating layer 320, a first source 331, a first drain 332, a second insulating layer 340, a second source 351, a second drain 352, a first nano-wire channel 333 and a second nano-wire channel 353.

The substrate 310 may be a silicon substrate. However, the substrate 310 is not limited to a silicon substrate, and may be any other semiconductor substrate that is capable of being used in a nano resonator.

The first insulating layer 320 is formed on the substrate 310 at a first position and a second position spaced apart from the first position, and includes $SiO_2$ or SiGe. The remaining portion of the substrate 310 between the first position and the second position is exposed.

A gate insulator 360 is formed on the portion of the substrate 310 that is exposed between the first insulating layers 320. A gate electrode 370 is formed on the gate insulator 360.

The first source 331 is formed on the first insulating layer 320 at the first position.

The first drain 332 is formed on the first insulating 320 at the second position so that the first drain faces the firs source 331.

One end of the first nano-wire channel 333 is connected to the first source 331, and the other end of the first nano-wire channel 333 is connected to the first drain 332. The first insulating layer 320 is not disposed between the substrate 310 and the first nano-wire channel 333, so that the first nano-wire channel 333 is spaced apart from the substrate 310, and is suspended from the first source 331 and the first drawing 332.

The first source 331, the first drain 332, and the first nano-wire channel 333 are doped with an n-type impurity or a p-type impurity, and the doping concentration is in a range of $1 \times 10^{19}/cm^{-3}$ to $1 \times 10^{20}/cm^{-3}$.

The first source 331, the first drain 332, and the first nano-wire channel 333 include any one or any combination of silicon, polysilicon, Ga, a-Si, SiGe, SiC, a Group III-semiconductor material, and a Group V-semiconductor material.

The first nano-wire channel 333 has a thickness in a direction perpendicular to the substrate 310 that is less than a maximum width $W_{max}$ of a depletion region that is formed in the first nano-wire channel 333. The maximum width $W_{max}$ of the depletion region is defined by Equation 1 discussed above.

The nano resonator 300 may include at least one additional nano-wire channel that is formed in a vertical direction of the first nano-wire channel 333, that is, in a direction perpendicular to the substrate 310.

In the example shown in FIG. 3, the nano resonator 300 includes a second nano-wire channel 353 that is disposed in a vertical direction of the first nano-wire channel 333. One end of the second nano-wire channel 353 is connected to the second source 351, and the other end of the second nano-wire channel 353 is connected to the second drain 352, so that the second nano-wire channel 353 is spaced apart from the first nano-wire channel 333, and is suspended from the second source 351 and the second drain 352.

Since the nano resonator 300 shown in FIG. 3 detects a signal having a frequency equal to a resonant frequency at which the two nano-wire channels 333 and 353 vibrate, the nano resonator 300 has a higher sensitivity compared to a resonator including a single resonance channel, for example, a single nano-wire channel. Also, since the first nano-wire channel 333 and the second nano-wire channel 353 are disposed in parallel, a loss of the nano resonator 300 in detecting the signal may be reduced.

Figure 4A:
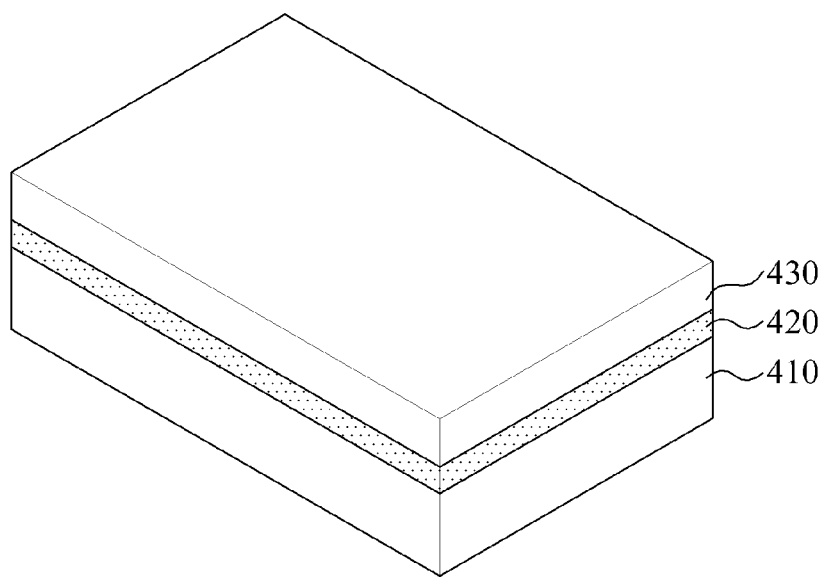
FIGS. 4A through 4C illustrate an example of a method of manufacturing a nano resonator.
Figure 4B:
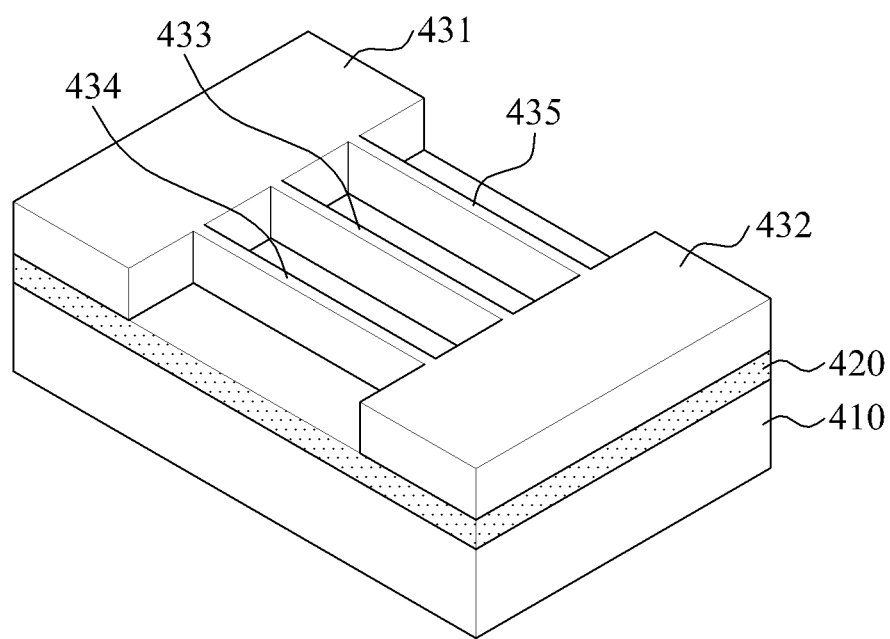
Figure 4C:
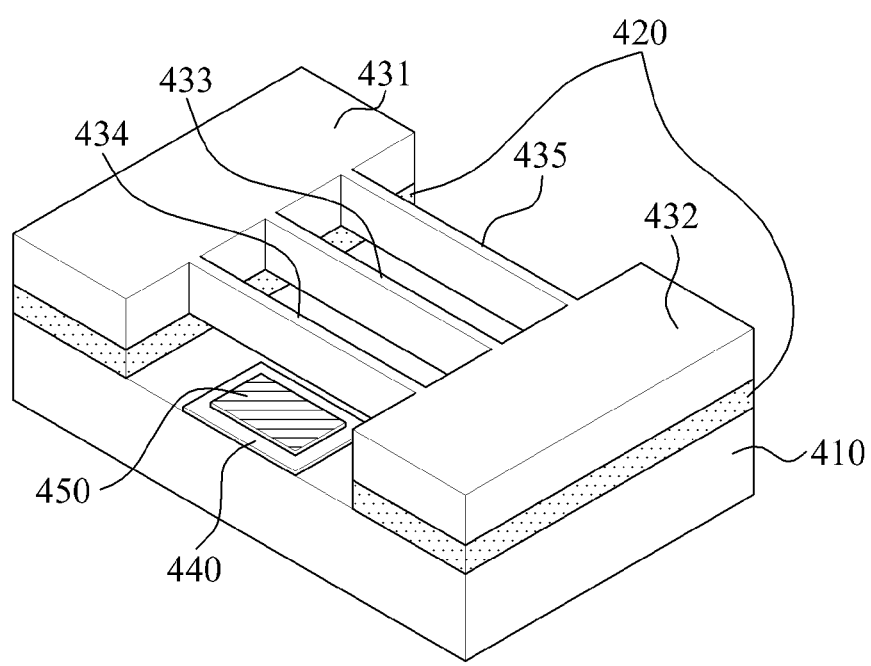

FIGS. 4A through 4C illustrate an example of a method of manufacturing a nano resonator. Referring to FIG. 4A, the method of manufacturing the nano resonator includes a process of depositing an insulating layer 420 on a silicon substrate 410, and depositing a semiconductor layer 430 on the insulating layer 420. The silicon substrate 410, the insulating layer 420, and the semiconductor layer 430 form a silicon on insulator (SOI) substrate.

The insulating layer 420 may by formed by depositing $SiO_2$ or SiGe on the silicon substrate 410. The semiconductor layer 430 may be formed by depositing any one or any combination of silicon, polysilicon, Ga, a-Si, SiGe, SiC, a Group III-semiconductor material, and a Group V-semiconductor material on the insulating layer 420.

The semiconductor layer 430 is doped with an n-type impurity or a p-type impurity, and may be annealed during the doping process. The doping concentration of the semiconductor layer 430 is in a range of $1 \times 10^{19}/cm^{-3}$ to $1 \times 10^{20}/cm^{-3}$.

Since a source, a drain, and a plurality of nano-wire channels are to be formed from the semiconductor layer 430, a deposition thickness of the semiconductor layer 430 is determined based on a thickness of the source, the drain, and the plurality of the nano-wire channels to be formed. In particular, the thickness of the semiconductor layer 430 is greater than the thickness of the insulating layer 420 based on the thickness of the plurality of the nano-wire channels. The thickness of each of the plurality of the nano-wire channels in a direction perpendicular to the silicon substrate 410 is less than a width $W_{max}$ of the depletion region defined by Equation 1 discussed above.

Referring to FIGS. 4B and 4C, the method of manufacturing the nano resonator includes etching the semiconductor layer 430 and the insulating layer 420 in an alternating manner.

First, as shown in FIG. 4B, a source 431, a drain 432, a first nano-wire channel 433, a second nano-wire channel 432, and a third nano-wire channel 435 are formed by etching the semiconductor layer 430. One end of each of the first nano-wire channel 433 to the third nano-wire channel 435 is connected to the source 431, and the other end of each is connected to the drain 432. The second nano-wire channel 434 and the third nano-wire channel 435 are formed at equal spacings from opposite sides of the first nano-wire channel 433, and are formed parallel to the first nano-wire channel 433.

The semiconductor layer 430 may be etched by anisotropic dry etching. Since an etching speed of anisotropic dry etching depends on a crystal orientation, the etching may be readily adjustable. Accordingly, the first nano-wire channel 433 to the third nano-wire channel 435 may be readily formed by anisotropic dry etching. Further, since the source 431, the drain 432, and the first nano-wire channel 433 to the third nano-wire channel 435 may be formed all at once by etching the semiconductor layer 430, ease of processing may be enhanced.

Next, as shown in FIG. 4C, the portion of the insulating layer 420 that is exposed by etching the semiconductor layer 430 is etched away. The insulating layer 420 may be etched away by isotropic wet etching. Through this etching process, the insulating layer 420 is removed except at a first position where the source 431 is located and a second position where the drain 432 is located, thereby exposing the silicon substrate 410 between the first position and the second position. Accordingly, the first nano-wire channel 433 to the third nano-wire channel 435 are spaced away from the silicon substrate 410, and are suspended from the source 431 and the drain 432.

A nano resonator having a structure identical to the structure of the nano resonator 100 shown in FIG. 1 may be manufactured by forming a gate insulating layer 440 on the portion of the silicon substrate 410 that is exposed by etching the insulating layer 420, and forming a gate electrode 450 on the gate insulating layer 440.

Although not shown, in a process of forming the source 431, the drain 432, and the first nano-wire channel 433 to the third nano-wire channel 435 by etching the semiconductor layer 430 shown in FIG. 4B, the source 431 and the drain 432 may additionally be etched. More particularly, the semiconductor layer 430 may be further etched to divide the source 431 and the drain 432 into sections in which the first nano-wire channel 433 to the third nano-wire channel 435 are connected to the source 431 and the drain 432. Through this etching process, a nano resonator having a structure identical to the structure of the nano resonator 200 shown in FIG. 2 may be manufactured.

Figure 5A:
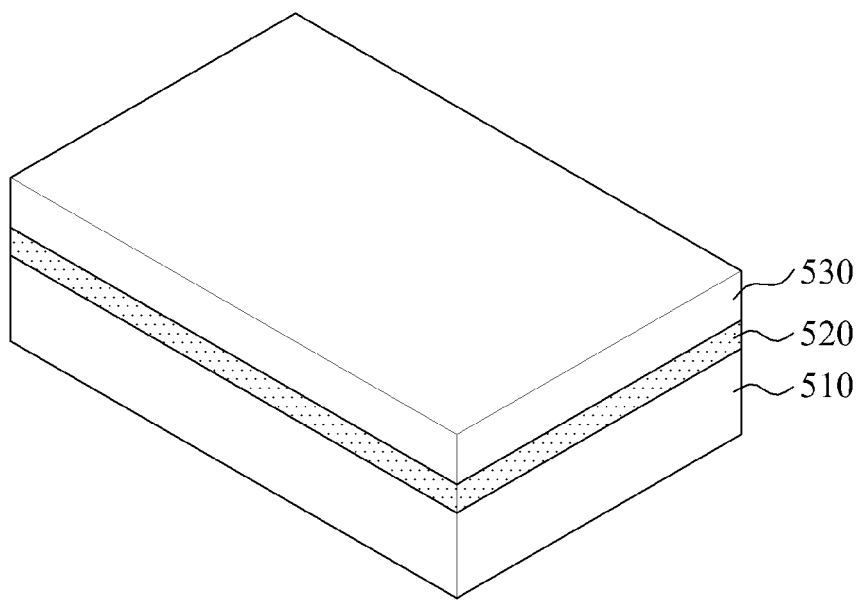
FIGS. 5A through 5D illustrate another example of a method of manufacturing a nano resonator.

FIGS. 5A through 5D illustrate another example of a method of manufacturing a nano resonator. Referring to FIG. 5A, the method of manufacturing the nano resonator includes a process of depositing a first insulating layer 520 on a silicon substrate 510, and depositing a first semiconductor layer 530 on the first insulating layer 520. The silicon substrate 510, the first insulating layer 520, and the first semiconductor layer 530 form an SOI substrate. The silicon substrate 510, the first insulating layer 520, and the first semiconductor layer 530 have a structure identical to the structure of the silicon substrate 410, the insulating layer 420, and the semiconductor layer 430 shown in FIG. 4A.

Figure 5B:
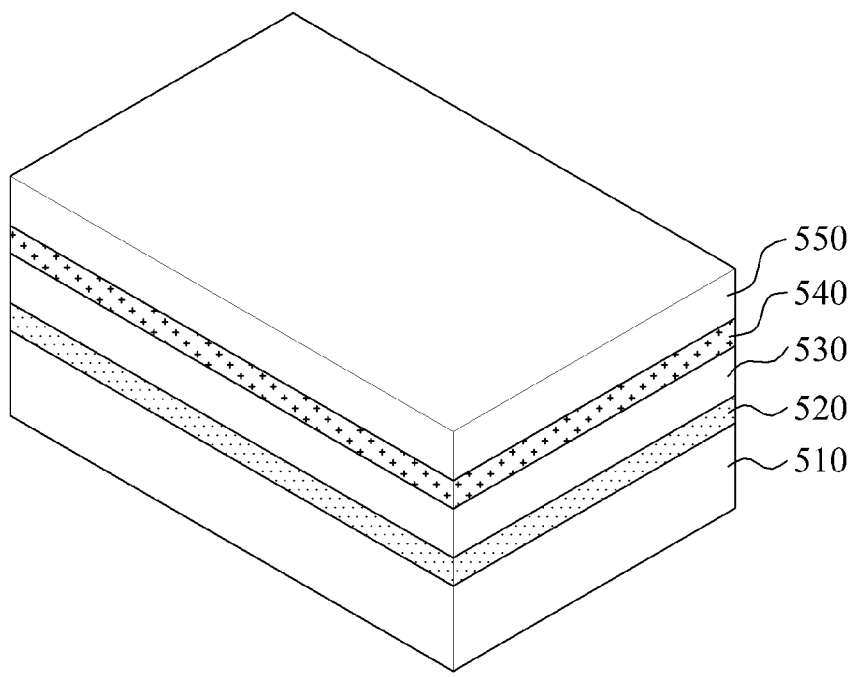

Referring to FIG. 5B, the method of manufacturing the nano resonator further includes depositing a second insulating layer 540 on the first semiconductor layer 530, and depositing a second semiconductor layer 550 on the second insulating layer 540. That is, the process of depositing an insulating layer and a semiconductor layer in turn is repeated twice in this example.

The first insulating layer 520 and the second insulating layer 540 are formed of either one or both of $SiO_2$ and SiGe. The first insulating layer 520 and the second insulating layer 540 may be formed of the same material or of a different material.

The first semiconductor layer 530 and the second semiconductor layer 550 are formed of any one or any combination of silicon, polysilicon, Ga, a-Si, SiGe, SiC, a Group III-semiconductor material, and a Group V-semiconductor material. The first semiconductor layer 530 and the second semiconductor layer 550 may be formed of the same material or of a different material.

Since a first source, a first drain, and a first nano-wire channel are to be formed from the first semiconductor layer 530, a deposition thickness of the first semiconductor layer 530 is determined based on a thickness of the first source, the first drain, and the first nano-wire channel to be formed.

Also, since a second source, a second drain, and a second nano-wire channel are to be formed from the second semiconductor layer 550, a deposition thickness of the second semiconductor layer 550 is determined based on a thickness of the second source, the second drain, and the second nano-wire channel to be formed.

The first semiconductor layer 530 and the second semiconductor layer 550 are doped with n n-type impurity or a p-type impurity, and may be annealed during the doping process. The doping concentration of the first semiconductor layer 530 and the second semiconductor layer 550 is in a range of $1 \times 10^{19}/cm^{-3}$ to $1 \times 10^{20}/cm^{-3}$. The doping concentration of the first semiconductor layer 530 and the second semiconductor layer 550 may be the same, or may be different.

Figure 5C:
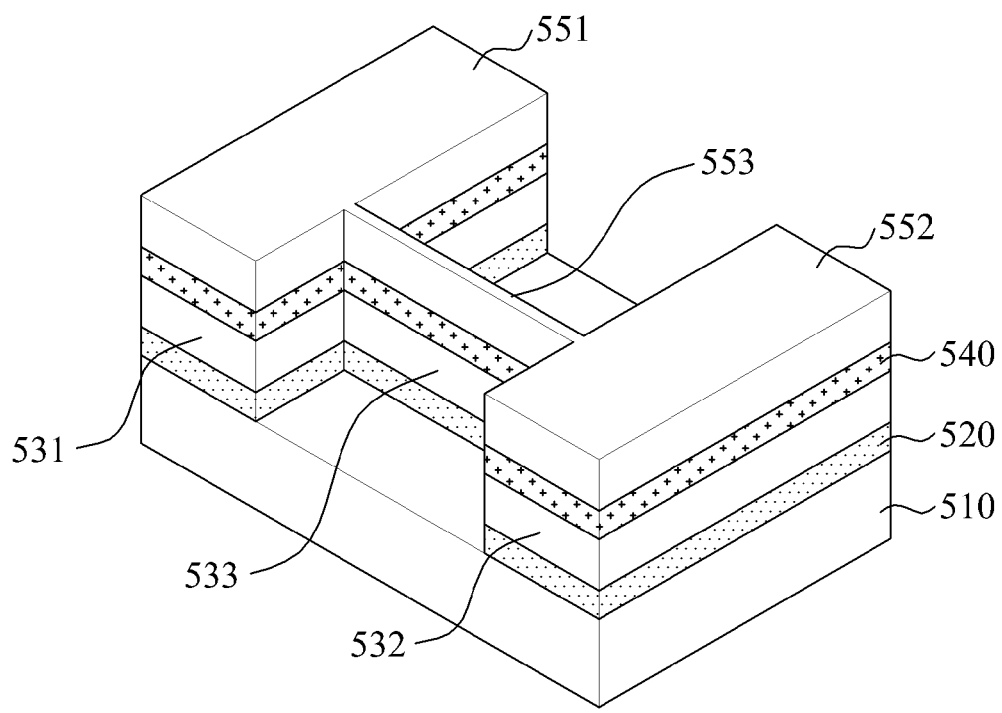
Figure 5D:
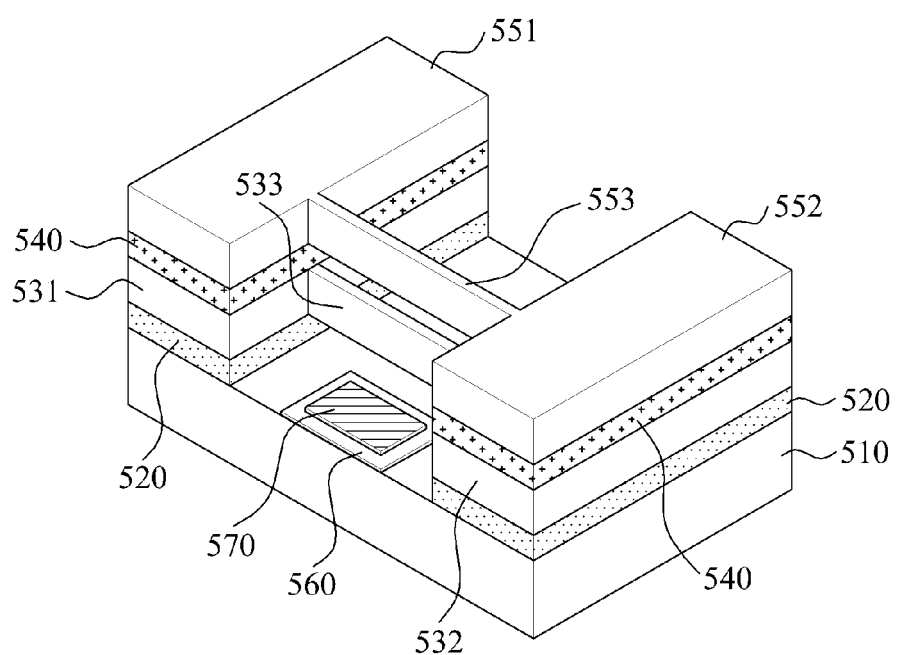

Referring to FIGS. 5C and 5D, the method of manufacturing the nano resonator further includes etching the second semiconductor layer 550, the second insulating layer 540, the first semiconductor layer 530, and the first insulating layer 520 in turn.

As shown in FIG. 5C, a second source 551, a second drain 552, and a second nano-wire channel 553 are formed by etching the second semiconductor layer 550. One end of the second nano-wire channel 553 is connected to the second source 551, and the other end of the second nano-wire channel 553 is connected to the second drain 552.

Next, the second insulating layer 540 is etched in a pattern corresponding to the second source 551, the second drain 552, and the second nano-wire channel 553.

Next, the first source 531, the first drain 532, and the first nano-wire channel 533 are formed by etching the first semiconductor layer 530. One end of the first nano-wire channel 533 is connected to the first source 531, and the other end of the first nano-wire channel 533 is connected to the first drain 532.

Next, the first insulating layer 520 is etched in a pattern corresponding to the first source 531, the first drain 532, and the first nano-wire channel 533.

As shown in FIG. 5D, the method of manufacturing the nano resonator further includes a process of etching away the portion of the second insulating layer 540 between the second nano-wire channel 553 and the first nano-wire channel 533, and a process of etching away the portion of the first insulating layer 520 between the first nano-wire channel 533 and the silicon substrate 510. As a result of these processes, the first nano-wire channel 533 is spaced away from the silicon substrate 510, and is suspended from the first source 531 and the first drain 532, and the second nano-wire channel 553 is spaced away from the first nano-wire channel 533, and is suspended from the second source 551 and the second drain 552. This enables the second nano-wire channel 553 to be formed in a vertical direction of the first nano-wire channel 533, that is, in a direction perpendicular to the substrate. Also, the suspended structure enables the first nano-wire channel 533 to vibrate between the first source 531 and the first source 532 at a resonant frequency of the first nano-wire channel 533 in response to a signal having a frequency equal to the resonant frequency of the first nano-wire channel 533, and the second nano-wire channel 553 to vibrate between the second source 551 and the second drain 552 at a resonant frequency of the second nano-wire channel 553 in response to a signal having a frequency equal to the resonant frequency of the second nano-wire channel 553, thereby performing a function of detecting a signal having a frequency equal to the resonant frequency of the first nano-wire channel 533, and detecting a signal having a frequency equal to the resonant frequency of the second nano-wire channel 553. The resonant frequencies of the first nano-wire channel 533 and the second nano-wire channel 553 may be the same, or they may be different.

Finally, a gate insulating layer 560 is formed on a portion of the silicon substrate 510 that is exposed by etching the first insulating layer 520, and a gate electrode 570 is formed on the gate insulating layer 560.

Figure 6A:
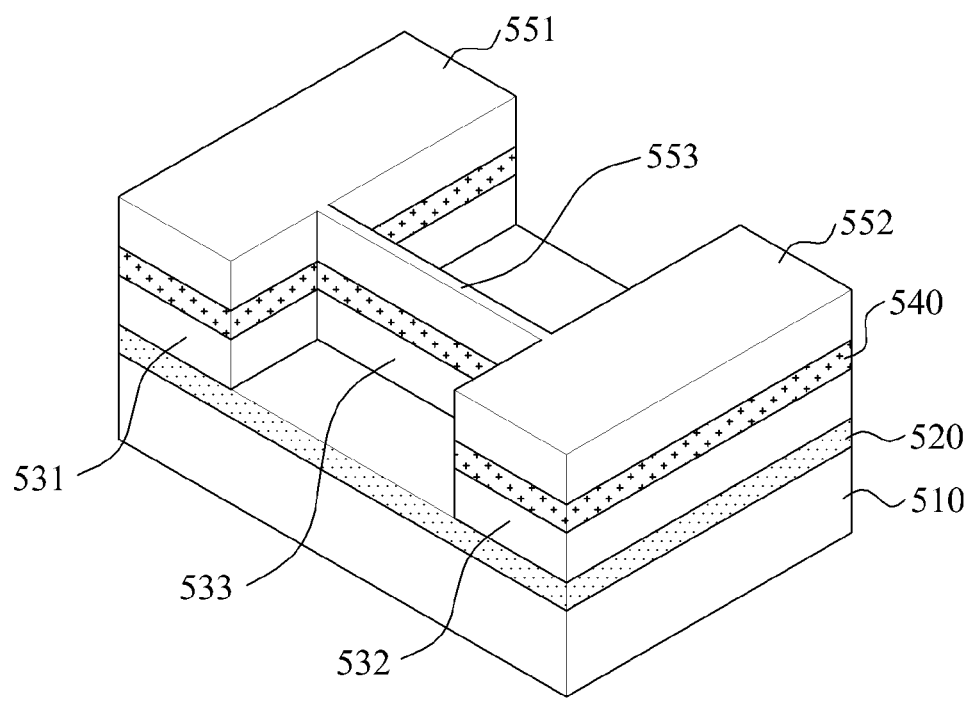
FIGS. 6A and 6B illustrate another example of a method of manufacturing a nano resonator.
Figure 6B:
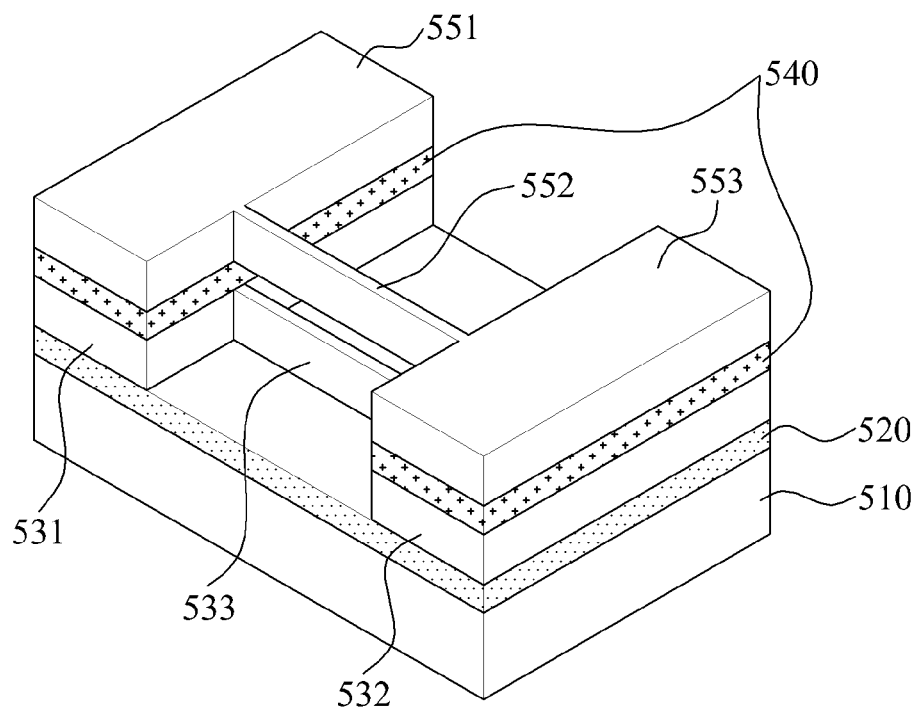

FIGS. 6A and 6B illustrate another example of a method of manufacturing a nano resonator. The method begins with structure in which a first insulating layer 520, a first semiconductor layer 530, a second insulating layer 540, and a second semiconductor layer 550 are formed on a silicon substrate 510 in as shown in FIG. 5B.

Referring to FIG. 6A, the method of manufacturing the nano resonator includes a process of etching the second semiconductor layer 550, the second insulating layer 540, and the first semiconductor layer 530 in turn.

First, the second semiconductor layer 550 is etched in a pattern of a second source 551, a second drain 552, and the second nano-wire channel 553.

Next, the second insulating layer 540 is etched in a pattern corresponding to the second source 551, the second drain 552, and the second nano-wire channel 553.

Next, the first semiconductor layer 530 is etched in a pattern of a first source 531, a first drain 532, and a first nano-wire channel 533. In this example, etching of the first insulating layer 520 is not performed. When etching of the first insulating layer 520 is not performed, the first nano-wire channel 533 is not spaced away from the silicon substrate 510, and is not suspended from the first source 531 and the first drain 532 as shown in FIG. 5D, but is joined to the first insulating layer 520 as shown in FIG. 6A. Accordingly, the first nano-wire channel 533 may function as a gate without having a resonance function, that is, without having the capability of vibrating between the first source 531 and the first drain 532 at a resonant frequency. Also, the first insulating layer 520 may function as a passivation layer for the silicon substrate 510 since it is not etched away in this example as it is in the example shown in FIG. 5C.

As shown in FIG. 6B, the method of manufacturing the nano resonator further includes a process of etching away the portion of the second insulating layer 540 between the first nano-wire channel 533 and the second nano-wire channel 553. As a result of this process, the second nano-wire channel 553 is spaced away from the first nano-wire channel 533, and is suspended from the second source 551 and the second drain 552. This suspended structure enables the second nano-wire channel 553 to vibrate between the second source 551 and the second drain 552 at a resonant frequency of the second nano-wire channel 553 in response to a signal having a frequency equal to the resonant frequency, thereby performing a function of detecting the signal.

According to the examples described above, a nano resonator having a high sensitivity may be manufactured by providing a plurality of nano-wire channels disposed in parallel.

Also, according to the examples described above, a method of manufacturing a nano resonator may be simple since a source, a drain, and a nano-wire channel have an identical doping type and doping concentration, and therefore form a junction-free structure.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A nano resonator comprising:
a substrate;
a first insulating layer disposed on the substrate;
a first source disposed on the first insulating layer at a first position;
a first drain disposed on the first insulating layer at a second position spaced apart from the first position so that the first drain faces the first source;
a first nano-wire channel having a first end connected to the first source and a second end connected to the first drain, and having a doping type and a doping concentration that are identical to a doping type and a doping concentration of the first source and the first drain; and
a second nano-wire channel disposed at a predetermined distance from the first nano-wire channel in a direction perpendicular to the substrate or a direction parallel to the substrate.

2. The nano resonator of claim 1, wherein the first insulating layer is not disposed between the substrate and the first nano-wire channel so that the first nano-wire channel is spaced apart from the substrate.

3. The nano resonator of claim 2, wherein the first insulating layer is not disposed on a portion of the substrate between the first position and the second position; and
the nano resonator further comprises:
a gate insulating layer disposed on the portion of the substrate where the first insulating layer is not disposed; and
a gate electrode disposed on the gate insulating layer.

4. The nano resonator of claim 1, wherein the doping concentration is in a range of $1\times10^{19}/cm^{-3}$ to $1\times10^{20}/cm^{-3}$.

5. The nano resonator of claim 1, wherein the first nano-wire channel has a thickness in a direction perpendicular to the substrate that is less than a maximum width of a depletion region in the first nano-wire channel.

6. The nano resonator of claim 1, wherein
the second nano-wire channel is disposed parallel to the first nano-wire channel at the predetermined distance from the first nano-wire channel in the direction parallel to the substrate,
a first end of the second nano-wire channel is connected to the first source, and a second end of the second nano-wire channel is connected to the first drain, and the second nano-wire channel has a doping type and a doping concentration that are identical to the doping type and the doping concentration of the first source and the first drain.

7. The nano resonator of claim 6, wherein
the first source and the first drain are divided into a first section in which the first nano-wire channel is connected to the first source and the first drain, and a second section in which the second nano-wire channel is connected to the first source and the first drain.

8. The nano resonator of claim 6, further comprising:
a third nano-wire channel disposed parallel to the first nano-wire channel and the second nano-wire channel at the predetermined distance from the first nano-wire channel in the direction parallel to the substrate so that the first nano-wire channel is disposed between the second nano-wire channel and the third nano-wire channel;
a first end of the third nano-wire channel is connected to the first source, and a second end of the third nano-wire channel is connected to the first drain; and
the third nano-wire channel has a doping type and a coping concentration that are identical to the doping type and the doping concentration of the first source and the first drain.

9. The nano resonator of claim 8, wherein
the first source and the first drain are divided into a first section in which the first nano-wire channel is connected to the first drain,
a second section in which the second nano-wire channel is connected to the first source and the first drain, and
a third section in wich the third nano-wire channel is connected to the first source and the first drain.

10. The nano resonator of claim 1, further comprising:
a second insulating layer disposed on the first source and the first drain;
a second source disposed on the second insulating layer at the first position; and
a second drain disposed on the second insulating layer at the second position so that the second drain faces the second source;
wherein the second nano-wire channel is disposed at the predetermined distance from the first nano-wire in the direction perpendicular to the substrate,
a first end of the second nano-wire channel is connected to the second source, and a second end of the second nano-wire channel is connected to the second drain, and
the second nano-wire channel has a doping type and a doping concentration that are identical to a doping type and a doping concentration of the second source and the second drain.

11. The nano resonator of claim 1, wherein the frist nano-wire channel is laterally connected to the first source by the first end and the first drain by the second end.

12. A method of manufacturing a nano resonator, the method comprising:
forming a first insulating layer on a substrate;
forming a first semiconductor layer on the first insulating layer, the first semiconductor layer having a predetermined doping type and a predetermined doping concentration;
forming a first source on the first insulating layer at a first position by etching the first semiconductor layer;
forming a first drain on the first insulating layer at a second position spaced apart from the first position so that the first drain faces the first source by etching the first semiconductor layer;
forming a first nano-wire channel having a first end connected to the first source and a second end connected to the first drain by etching the first semiconductor layer; and
forming a second nano-wire channel disposed at a predetermined distance from the first nano-wire channel in a direction perpendicular to the substrate or a direction parallel to the substrate.

13. The method of claim 12, wherein
the etching of the first semiconductor layer to form the first source, the first drain, and the first nano-wire channel exposes a portion of the first insulating layer; and
the method further comprises etching away the exposed portion of the first insulating layer.

14. The method of claim 13, further comprising etching away a portion of the first insulating layer between the substrate and the first nano-wire channel so that the first nano-wire channel is spaced apart from the substrate.

15. The method of claim 13, wherein the etching away of the exposed portion of the first insulating layer exposes a portion of the substrate; and
the method further comprises:
forming a gate insulating layer on a portion of the exposed portion of the substrate; and
forming a gate electrode on the gate insulating layer.

16. The method of claim 13, wherein the first nano-wire channel is suspended above the substrate and between the first source and the first drain.

17. The method of claim 12, wherein the predetermined doping concentration is in a range of $1\times10^{19}/cm^{-3}$ to $1\times10^{20}/cm^{-3}$.

18. The method of claim 12, wherein the first nano-wire channel has a thickness in a direction perpendicular to the substrate that is less than a width of a depletion region in the first nano-wire channel.

19. The method of claim 12, wherein the forming of the second nano-wire channel comprises forming the second nano-wire channel by etching the first semiconductor layer so that the second nano-wire channel is disposed parallel to the first nano-wire channel at the predetermined distance from the first nano-wire channel in the direction parallel to the substrate, a first end of the second nano-wire channel is connected to the first source, and a second end of the second nano-wire channel is connected to the first drain.

20. The method of claim 19, further comprising etching the first source and the first drain to divide the first source and the first drain into a first section in which the first nano-wire channel is connected to the first source and the first drain, and a second section in which the second nano-wire channel is connected to the first source and the first drain.

21. The method of claim 19, further comprising forming a third nano-wire channel by etching the first semiconductor layer so that the third nano-wire channel is disposed parallel to the first nano-wire channel and the second nano-wire channel at the predetermined distance from the first nano-wire channel in the direction parallel to the substrate, the first nano-wire channel is disposed between the second nano-wire channel and the third nano-wire channel, a first end of the third nano-wire channel is connected to the first source, and a second end of the third nano-wire channel is connected to the first drain.

22. The method of claim 21, further comprising etching the first source and the first drain to divide the first source and the first drain into a first section in which the first nano-wire channel is connected to the first source and the first drain, a second section in which the second nano-wire channel is connected to the first source and the first drain, and a third section in which the third nano-wire channel is connected to the first source and the first drain.

23. The method of claim 12, further comprising:
  forming a second insulating layer on the first semiconductor layer before etching the first semiconductor layer; and
  forming a second semiconductor layer on the second insulating layer, the second semiconductor layer having a predetermined doping type and a predetermined doping concentration.

24. The method of claim 23, wherein the forming of the second nano-wire channel comprises:
  forming a second source on the second insulating layer at the first position by etching the second semiconductor layer;
  forming a second drain on the second insulating layer at the second position so that the second drain faces the second source by etching the second semiconductor layer; and
  forming the second nano-wire channel by etching the second semiconductor layer so that a first end of the second nano-wire channel is connected to the second source, a second end of the second nano-wire channel is connected to the second drain, and the second nano-wire channel is disposed at the predetermined distance from the first nano-wire channel in the direction perpendicular to the substrate.

\* \* \* \* \*